United States Patent [19]

Chappell et al.

[11] Patent Number: 4,998,028
[45] Date of Patent: Mar. 5, 1991

[54] HIGH SPEED CMOS LOGIC DEVICE FOR PROVIDING ECL COMPATIBLE LOGIC LEVELS

[75] Inventors: Barbara A. Chappell; Terry I. Chappell, both of Amawalk; Stanley E. Schuster, Granite Springs, all of N.Y.

[73] Assignee: International Business Machines Corp., Armonk, N.Y.

[21] Appl. No.: 471,155

[22] Filed: Jan. 26, 1990

[51] Int. Cl.$^5$ ............... H03K 19/092; H03K 19/094; H03K 19/017; H03K 17/04

[52] U.S. Cl. .................. 307/475; 307/450; 307/451; 307/443; 307/448; 307/585

[58] Field of Search ............ 307/475, 450, 451, 443, 307/585, 448, 270, 576, 579, 542, 355, 356, 358, 363, 455

[56] References Cited

U.S. PATENT DOCUMENTS

| 4,797,583 | 1/1989 | Ueno et al. | 307/475 |
| 4,806,802 | 2/1989 | Okitaka et al. | 307/451 X |
| 4,835,419 | 5/1989 | Chappell et al. | 307/451 X |
| 4,845,381 | 7/1989 | Cuevas | 307/475 X |
| 4,906,871 | 3/1990 | Iida | 307/475 |
| 4,947,061 | 8/1990 | Metz et al. | 307/475 |

Primary Examiner—Stanley D. Miller
Assistant Examiner—David R. Bertelson
Attorney, Agent, or Firm—Pollock, Vande Sande & Priddy

[57] ABSTRACT

CMOS ECL drive circuit for providing regulated ECL logic levels. A CMOS logic circuit is connected by parallel N channel and P channel devices to serially connected N and P channel devices. The serially connected N and P channel devices are connected across a CMOS power supply with gate connections connected to the logic circuit. The parallel devices provide a regulating feedback current to one of the serially connected P channel and N channel devices during each of first and second ECL logic states. The feedback current effectively controls the bias on the gate connections of the serially connected P and N channel devices. The voltage at the junction of the serially connected P and N channel devices is regulated by each of the parallel connected devices.

13 Claims, 10 Drawing Sheets

NDO/1 ———  NA/1 — · —  NI/1 — — —

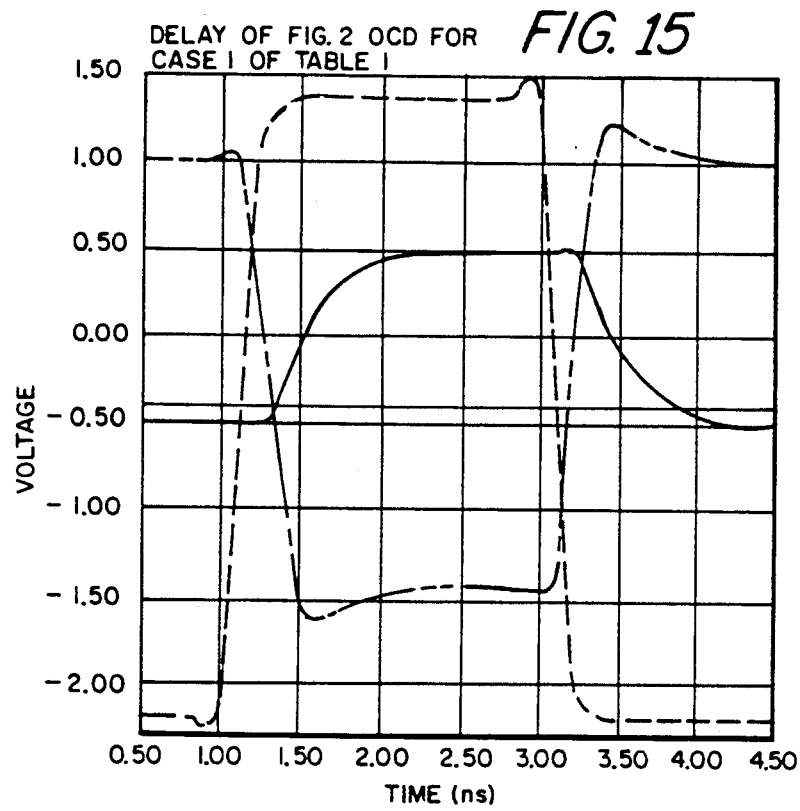
FIG. 15 DELAY OF FIG. 2 OCD FOR CASE I OF TABLE I
NDO/I ——— NA/I —·—·— NI/I - - - - -
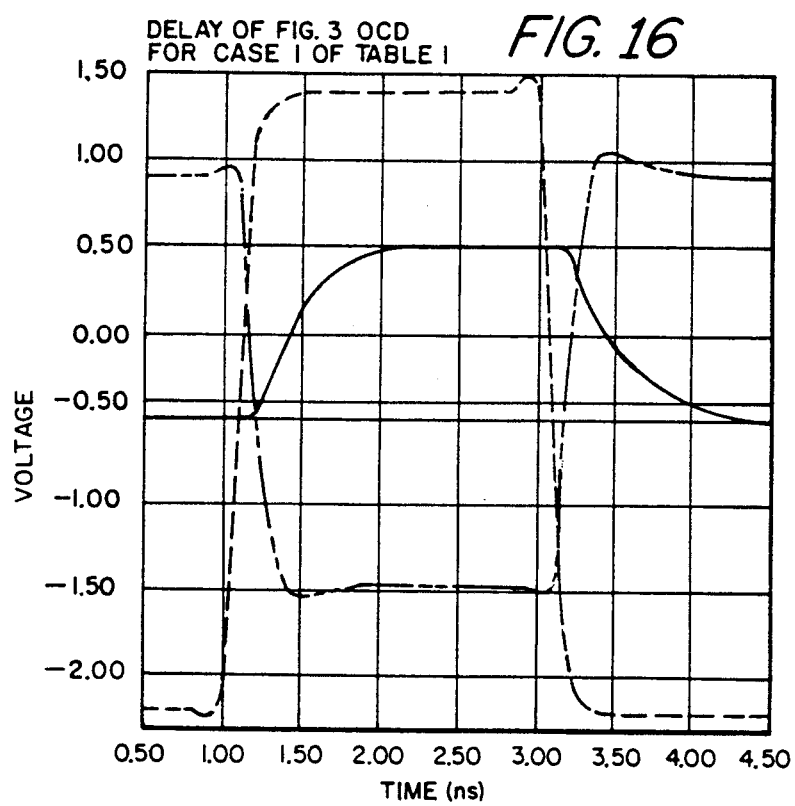
FIG. 16 DELAY OF FIG. 3 OCD FOR CASE I OF TABLE I
NDO/I ——— NA/I —·—·— NI/I - - - - -

HIGH SPEED CMOS LOGIC DEVICE FOR PROVIDING ECL COMPATIBLE LOGIC LEVELS

The present invention relates to high speed CMOS logic circuits. Specifically, a CMOS logic circuit is described for converting CMOS signal levels to small signal levels such as ECL logic signal levels.

In the digital electronics arts, high speed switching requirements have favored the use of emitter coupled logic circuits, ECL, to achieve very fast switching times needed for the ever-increasing switching speeds for digital devices. ECL technology is bipolar and tends to be more expensive to manufacture than the lower speed CMOS devices. The lower speed CMOS devices have virtues of their own, including an ability to package them in higher densities, as well as operating them at logic levels which have a higher noise margin. The CMOS circuitry additionally consumes less power than conventional ECL bipolar technology.

CMOS technology is progressing to the point where unloaded circuits switch at speeds in the region of 0.10 nanoseconds. CMOS SRAM memory access times of under 10 nanoseconds are achievable. The improvement in CMOS devices has made these higher speed circuits and memories possible. With the CMOS device speed approaching that of ECL logic, it would therefore be advantageous to operate the CMOS circuits at ECL signal levels.

ECL signal levels are much lower than typical CMOS circuit signal levels. At a given slew rate ECL logic can switch at much higher speeds than CMOS logic elements. Implementing CMOS circuits, operating at their conventional CMOS power supply voltage levels, while at the same time producing ECL-compatible signal levels would obtain the benefits of the traditionally faster switching ECL circuits while retaining the cost advantages of CMOS-implemented circuit devices.

In order to operate CMOS circuits at lower output voltage levels, the stability of the lower levels must be accurately maintained in order to insure adequate noise margins. This signal level stability must be achieved in the face of normal process tolerances which occur in CMOS fabrication techniques. Additionally, normal variations in power supply voltage which occur when operating CMOS devices adversely effects the signal voltage levels. Changes in loading to the device also adversely effect the signal level stability. In the face of the need for logic voltage level stability, care must be taken to stabilize the circuit to avoid these adverse effects.

Other important circuit interactions of CMOS circuits which must be controlled include device delay, as well as slew rate. Circuit delay should be limited in order to preserve the desirable high switching speeds. However, this goal may be adverse to maintaining slew rates at a level which would not exceed 1 volt per nanosecond, for example. As is known to skilled circuit designers, excessive slew rates will generate excessive noise which may interfere with circuit operation.

SUMMARY OF THE INVENTION

It is an object of this invention to provide CMOS circuitry which generates compatible small signal levels at compatible switching speeds and slew rates.

It is a more specific object of this invention to maintain precise level control of smaller ECL-compatible signal levels.

It is another object of this invention to maintain control over CMOS circuit generated small signal levels in the face of process tolerances and power supply variations under which such circuits normally operate.

These and other objects of the invention are provided by a CMOS ECL off-chip driver circuit. The device is completely fabricated in CMOS technology, using standard CMOS operating potentials $V_{DD}$-$V_{SS}$. The circuit is capable of providing smaller ECL-compatible signal levels from CMOS logic signals, having a voltage swing much less than conventional CMOS logic levels. The circuit is capable of driving normally encountered transmission line structures interconnecting ECL circuits, and still maintain signal voltage level stability.

The reduced ECL-compatible signal levels are maintained stable through the use of a feedback path connected between the gates of a P channel and N channel device, serially connected between the CMOS power supply terminals, and an output signal function formed at the series connection of the N channel and P channel devices. The feedback devices will permit the output signal junction node to be switched between first and second ECL compatible voltage levels, holding the output junction node at the required ECL signal level.

Various embodiments of the invention are described, each of which has some virtue over the other in the tradeoff between output signal level stability, circuit delay and slew rate control. All the embodiments of the invention are capable of driving a range of transmission line loads with small signals which are compatible with ECL circuits.

In one embodiment of the invention, an output load element is included at the output junction to provide a substantially constant impedance to the device, further insuring level control of the output signal level in the face of different terminating characteristics for the device.

In implementing the feedback network, a P channel device and N channel CMOS device are connected in parallel between the output junction and the gate connections of the two serially-connected P channel and N channel output devices. One or the other of such feedback devices will be conducting so as to control the voltage level applied to the gates in a direction to maintain small signal levels at the output junction. Ample current is supplied by the two P and N channel devices to any expected load, which may be connected to the output junction.

As will be seen from the various embodiments of the invention, a slew rate, output level control and circuit delay may all be optimized depending on a particular application.

BRIEF DESCRIPTION OF THE FIGURES

FIGS. 14-17 illustrate the propagation delay of the embodiment shown in FIGS. 1-4 for the process variations and operating power supply voltage variations of case 1 of Table 1.

DESCRIPTION OF THE PREFERRED EMBODIMENT

Figure 1:
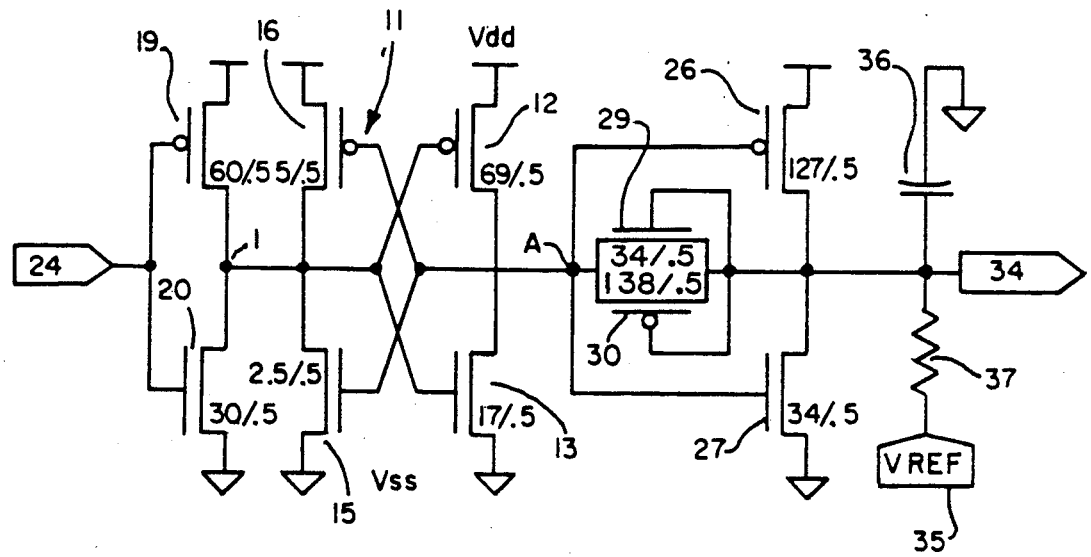
FIG. 1 illustrates a first embodiment of the invention implementing feedback control over ECL-compatible signal levels.

Referring now to FIGS. 1-4, there is shown various embodiments of a CMOS off-chip driver (OCD) circuit in accordance with the present invention, which will provide for ECL-compatible small signal levels. The circuits shown are designed for implementation in 0.5 micrometer channel length, 3.6 volt CMOS technology. The invention is not limited to this particular selection of power supply voltage. The circuits shown operate from conventional CMOS power supplies represented by terminals $V_{DD}$ and $V_{SS}$. The input signals to the circuits are CMOS logic levels connected through a circuit pad 24. The CMOS portion shown is itself exemplary, and not indicative of any limitation as to CMOS circuitry which might be used to develop the compatible ECL signal levels.

Each of the devices shown includes a CMOS portion having an output node A. The particular implementation shown in the Figures includes a latch 11 having a pair of P channel, field effect transistors 12 and 16, serially connected with N channel, field effect transistors 13 and 15. These field effect transistors which are used in implementing the invention are hereinafter referred to as a P channel device or an N channel device, as is conventional with CMOS circuit design literature. Also shown in the Figures is the channel length to width dimensions for each of the selected devices which are exemplary only for implementing the present for the 3.6 volt power supply, $V_{DD}$, $V_{SS}$.

The latch 11 is driven by a series combination of P channel device 19 and N channel device 20. These devices have common gate connections which are connected to a circuit pad 24 connected to a source of logic signals operating at the CMOS signal levels. CMOS logic levels are produced on node 1, the junction of devices 19 and 20.

The signal level established on node A is connected by the output devices comprising a P channel device 26 and N channel device 27 having the shown dimensions to the output node 34. A load is illustrated as comprising a linear resistance 37 connected between a source of reference potential pad 35 and the output node 34. As is known in conventional bipolar technology, such a voltage reference would normally be available which establishes a reference voltage roughly midway between the power supply and ground levels in IBM systems. A capacitance 36 is shown representing the package and transmission line capacitance terminating the device output pad 34.

In each of the circuits shown, the ECL-compatible output voltage for the device appears at the junction of each of the P channel and N channel devices 26 and 27.

In each of the embodiments shown, a pair of P channel and N channel devices 29 and 30 are shown connecting the junction of P channel and N channel devices 26 and 27 to output node A of the CMOS logic circuit 11. The CMOS logic circuit 11 has output devices 12 and 13 dimensioned to provide nominal output signal levels which are approximately 1.0 and −1.5 volts. Nominal CMOS levels in this configuration would be 1.4 volts and −2.2 volts. Thus, CMOS logic circuit 11 produces signal levels intermediate to CMOS logic levels and ECL logic levels.

Establishing nominal voltage levels at junction A which are intermediate to the nominal CMOS logic signal levels permits the voltage at junction A to increase or decrease as feedback devices 29 and 30 supply more or less current to junction A. The voltage on junction A will regulate the potential at the output pad 34 by increasing or decreasing the drive on the gates of series connected P channel device 26 or N channel device 27. The result is a stabilizing of the smaller ECL-compatible logic levels developed at output pad 34.

The compatible ECL logic voltage levels are selected to be +0.5 and −0.5 volts. The aforesaid reference potential is 0 volts which is used in IBM implemented bipolar technology to distinguish between a logic 1 and logic 0 condition for the ECL logic states.

To obtain the reduction in logic levels from CMOS to ECL-compatible levels, the feedback transistors 29 and 30 are employed. Each of the feedback transistors 29 and 30 participate in various degrees in the different embodiments in forming a voltage divider with P channel devices 12, 26 and N channel devices 13, 27, depending on the logic state at node A. The voltage at node A will force one of the p channel and N channel devices 29 and 30 to conduct substantially more current than the remaining device. Node A will have a nominal voltage level about 0.5 volts less than the standard CMOS logic up level and about 0.5 V greater than the standard CMOS logic down level. Depending on the output logic state on output pad 34, the P channel device 26 or N channel device 27 will conduct current. The voltage which is developed at the junction of these two P channel and N channel devices 26 and 27 is in part determined by the feedback device 29 or 30. As the potential at the junction of P channel device 26 and N channel device 27 changes, the feedback devices 29 and 30 will cause the voltage at the gate connections to P channel device 26 and N channel device 27 to change in a direction to compensate for any changes in output signal level. Thus, for a logic 1 ECL level in the example of FIG. 1, a lowering of the potential at output pad 34 will tend to lower the voltage at node A which will turn device 26 on more, increasing the output voltage level on output pad 34 to an ECL-compatible voltage. In the opposite logic state, negative feedback through the P channel device 30 will adjust the voltage at node A and the gate of N channel device 27 so as to maintain the desired ECL voltage level on output pad 34.

Figure 2:
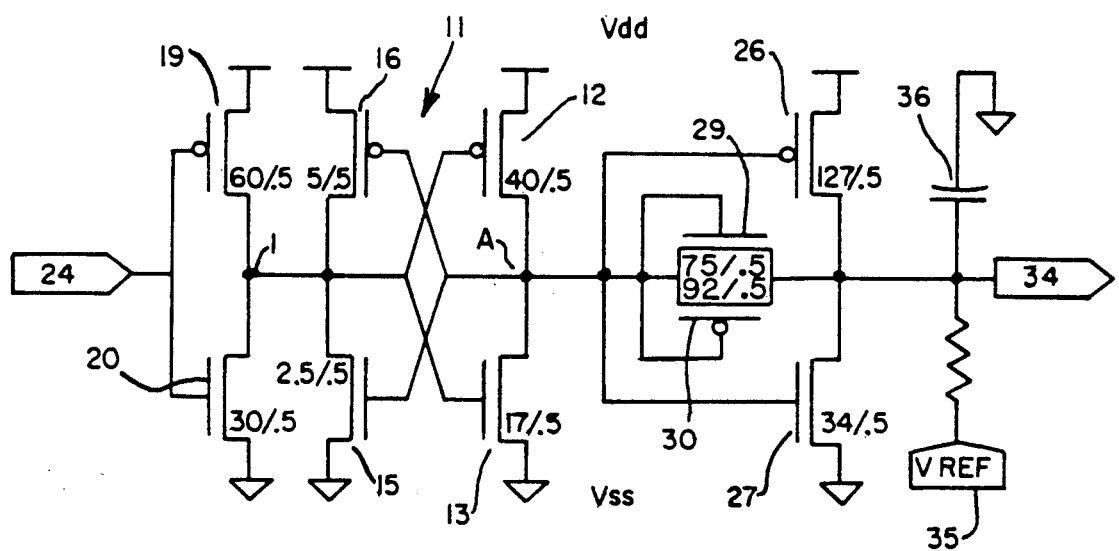
FIG. 2 shows another embodiment of the invention for implementing feedback control for improving level control of the ECL-compatible signal levels.
Figure 3:
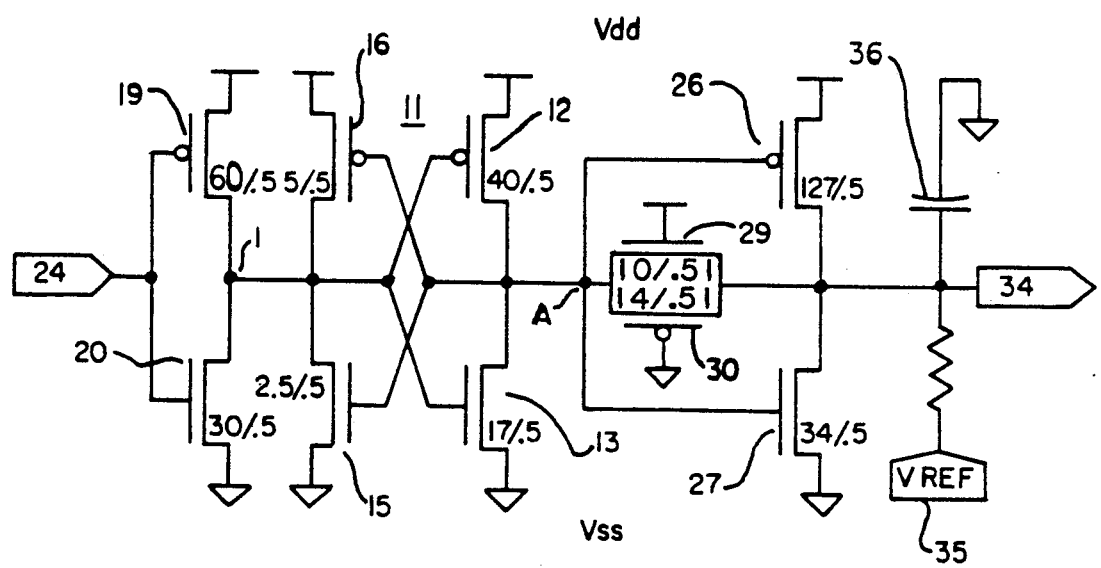
FIG. 3 shows yet another embodiment of the invention demonstrating improved switching delay characteristics over the embodiments of FIGS. 1 and 2.
Figure 4:
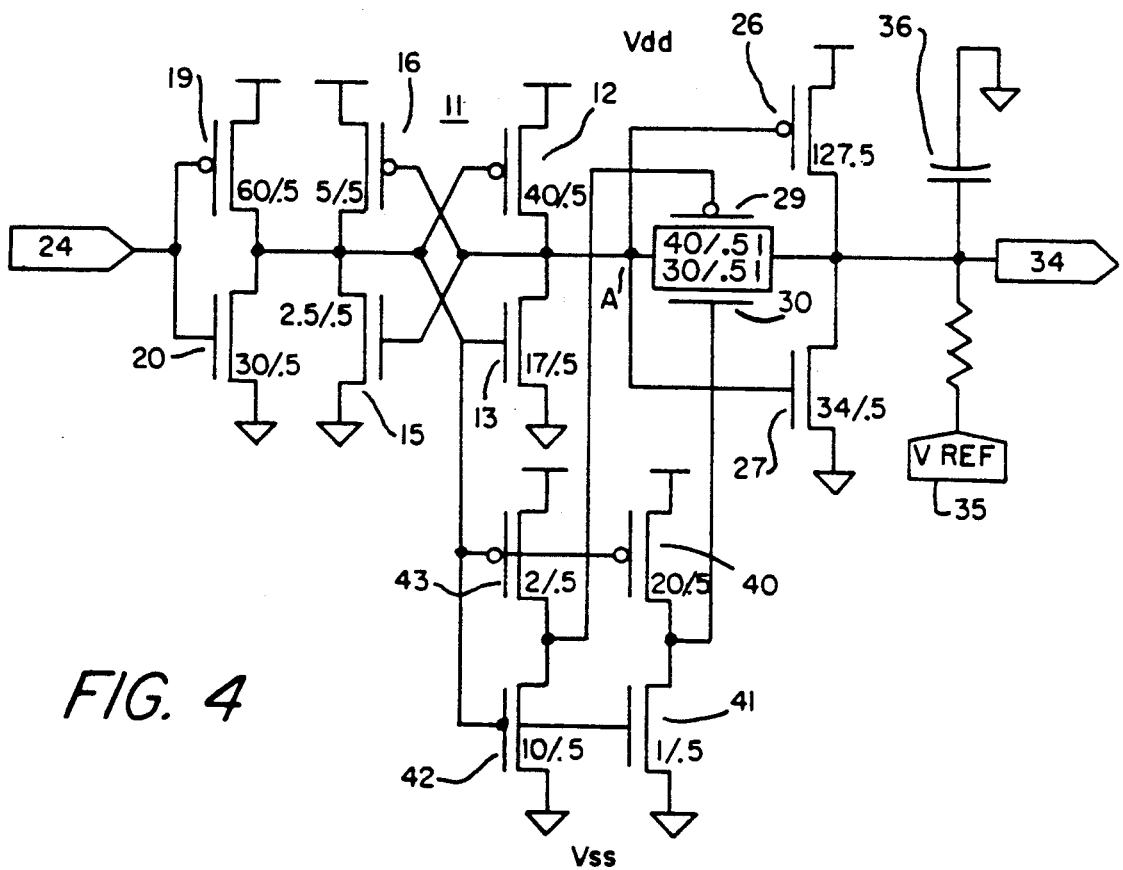
FIG. 4 shows another embodiment of the invention which provides even more precise control over output signal levels.

The circuits of FIGS. 1 and 2 illustrate implementations where the gates of the feedback devices 29 and 30 are connected together to either the output pad 34 or the input node A. In the circuits of FIGS. 3 and 4, these gates are returned to a higher potential, corresponding to $V_{DD}$ and $V_{SS}$, which provide certain advantages and disadvantages with respect to the implementations of FIGS. 1 and 2. In FIG. 3, devices 29 and 30 are fully turned on, which assist in making each of the transistors smaller, providing an overall improvement in the transient response for the device. In FIG. 4, the feedback devices 29 and 30 are shown connected to pairs of serially connected P channel and N channel devices 40, 41 and 42, 43. The effect of these additional devices is to delay the conduction of feedback devices 29 and 30 during changes from one logic state to another. As will be seen when further performance figures are examined with respect to these embodiments, better slew rate control is achieved with the embodiment of FIG. 4 by providing a small amount of delay in turning off transistor 29 during a transition from a high logic level state to a low logic level state.

All the circuits shown in FIGS. 1-4 have a regulated ECL-compatible logic level output. In the embodiment implemented by the IBM Corporation, the +0.5 and −0.5 voltage potentials are regulated against process variations which occur in the manufacture of CMOS devices. As is known in the manufacture of CMOS circuits, variations in the channel length, width and device thresholds may occur varying the circuit performance. Additionally, changes in the CMOS power supply levels $V_{DD}$ and $V_{SS}$ will adversely effect the logic levels.

Performance of the circuits in FIGS. 1-4 was evaluated with respect to the ability of the circuit to maintain the ECL-compatible logic level voltages at their nominal values of +0.5 and −0.5 volts, the respective slew rates for the circuits, and the respective propagation delays for switching each of the circuits. The circuit performance was evaluated under the conditions of process variations and power supply variations shown in Table 1 below. The circuit performance for these conditions is depicted in the graphs of FIGS. 6-17.

A will maintain the ECL logic state "0" voltage level at its nominal value. In this condition, any potential change at the junction of P channel devices 26 and 27 is compensated for by more or less voltage being applied to the gate of device 27. The particular arrangement of transistors during each of these logic states in the device of FIG. 1 results in the least tolerance to process variations and power supply variations in its ability to control the output logic level voltage compared to the circuits of FIGS. 2-4. As demonstrated in FIGS. 6 and 7, the device of FIG. 2 is less sensitive to process and power supply variations for the seven process variations of Table 1 than the circuit of FIG. 1. The reason for this can be seen by examining the circuit configuration for each of the logic states. The superior performance of FIG. 2 results to a large extent from the fact that the output devices 26, 27, during the respective ECL logic states "1" or "0" will have a feedback device 30 or 29 which is the same type, P or N, participating in the generation of the respective ECL logic signal levels.

Figure 8:
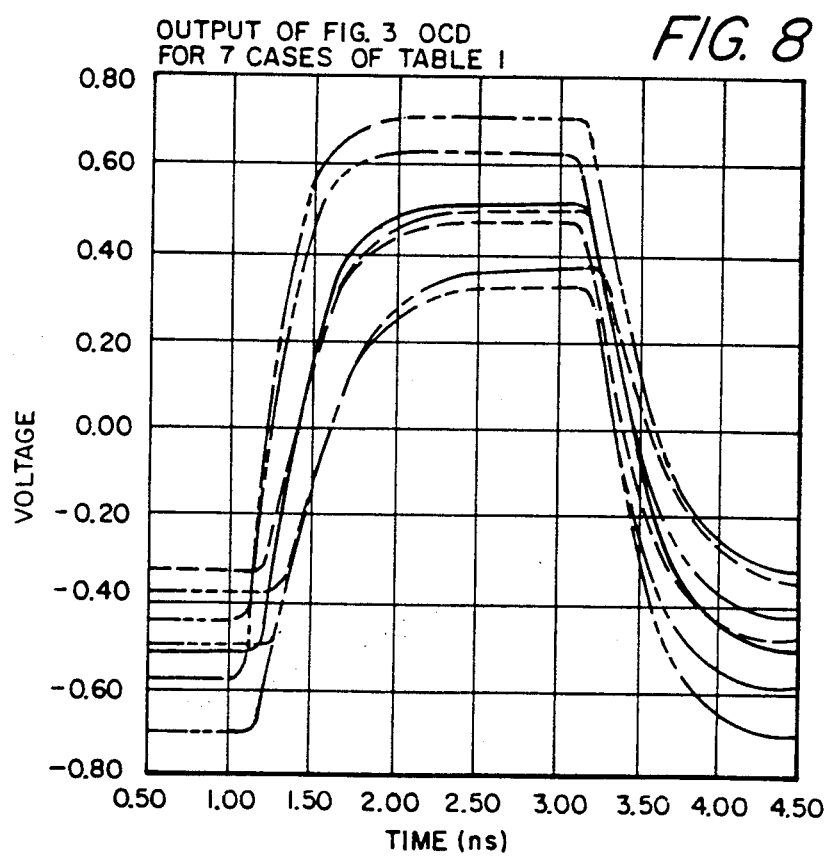
Figure 9:
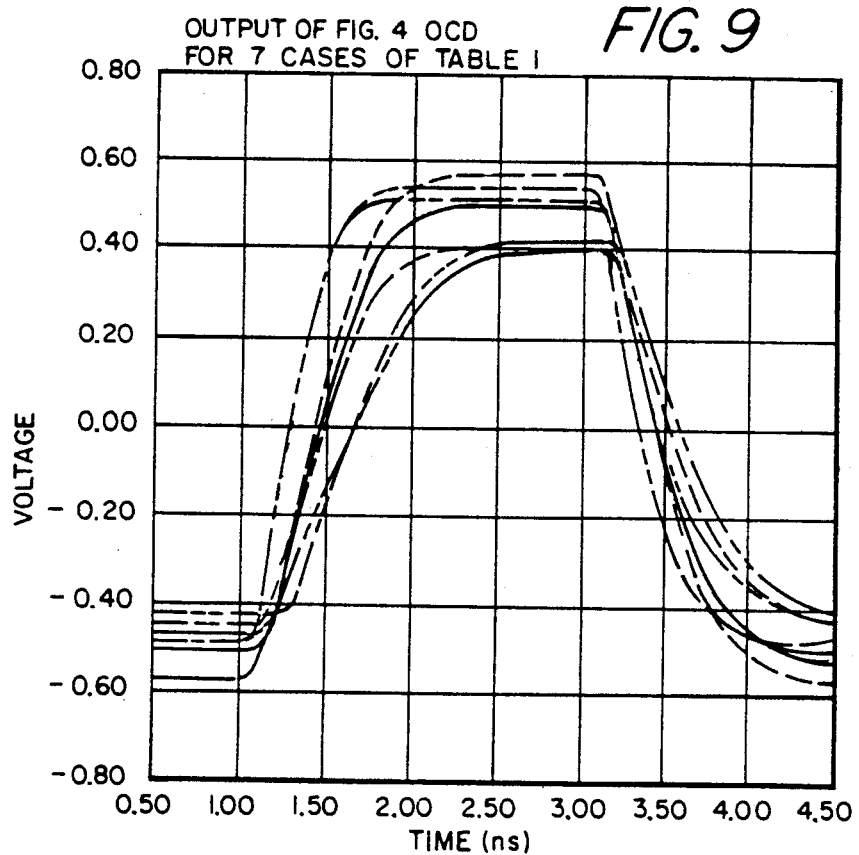
Figure 10:
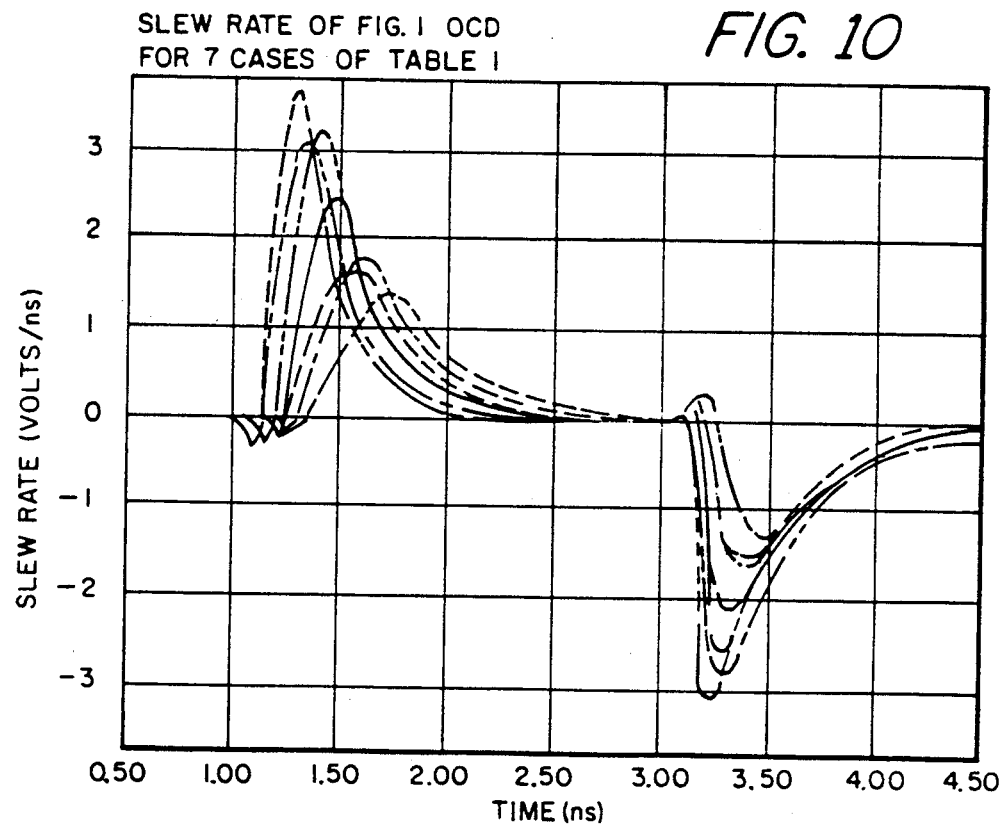
FIGS. 10-13 illustrate the slew rate characteristics under seven different process variations and operating power supply voltage variations of Table 1.
Figure 11:
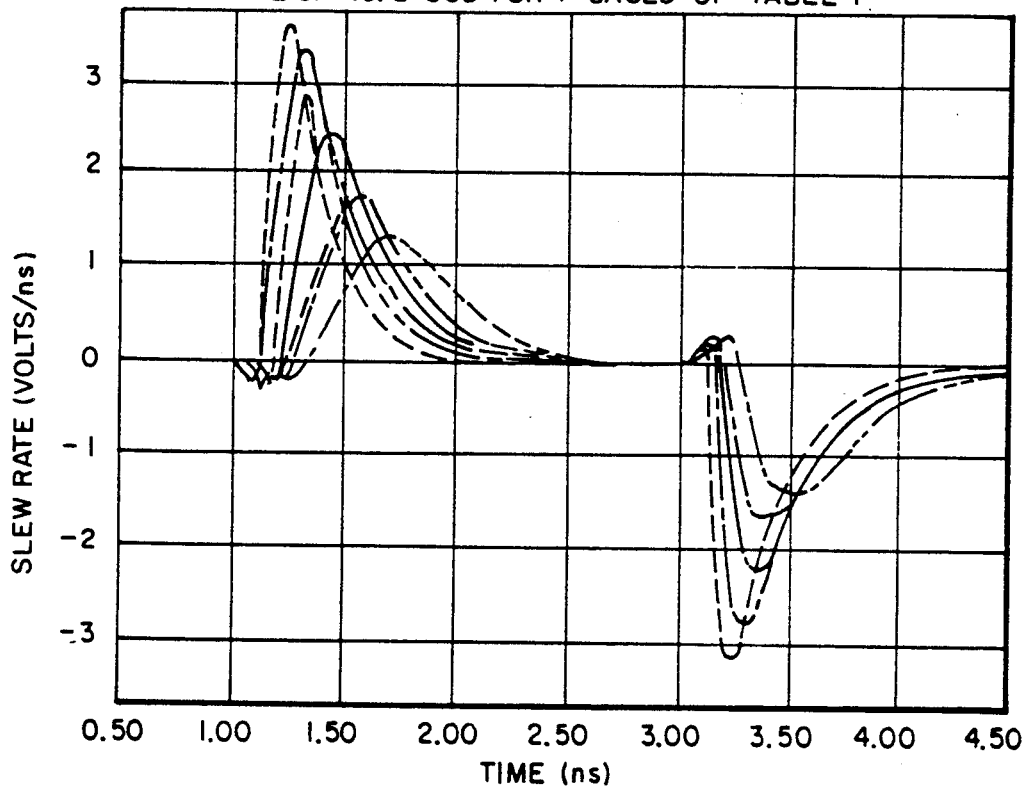
Figure 12:
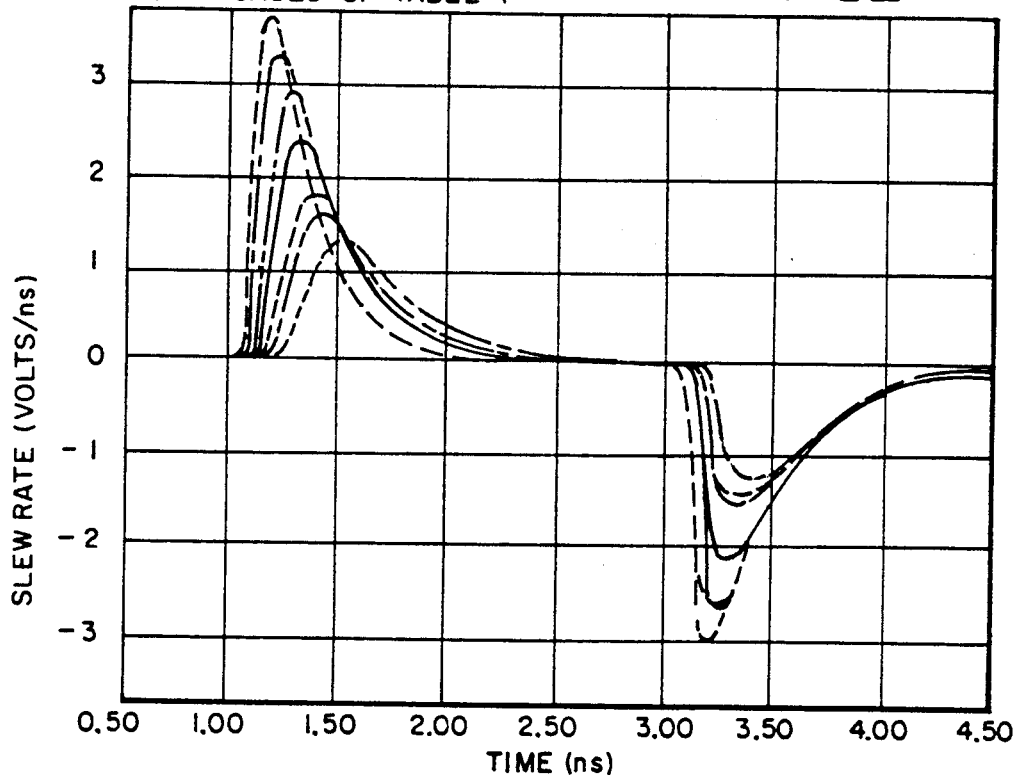
Figure 13:
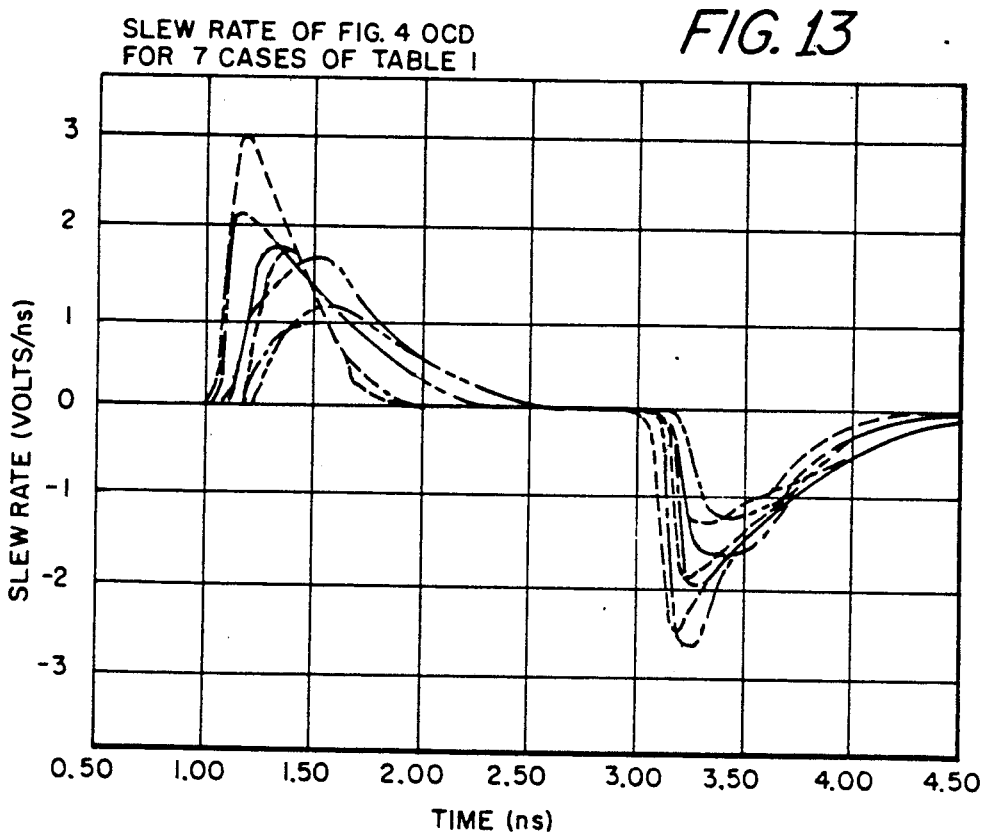
Figure 14:
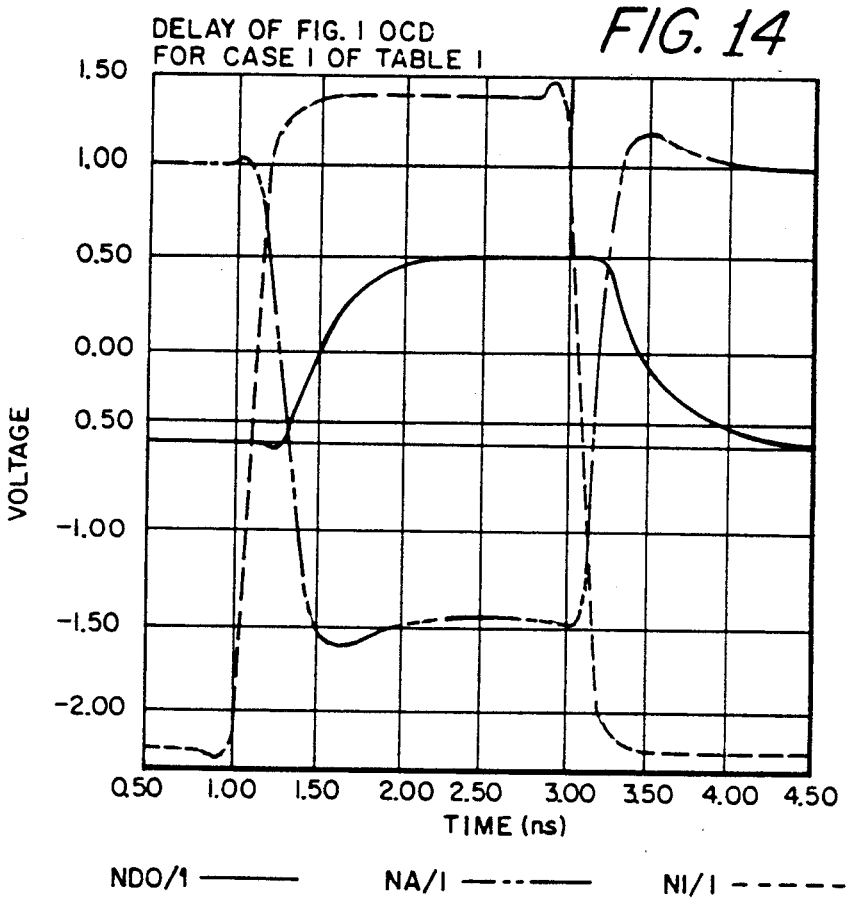
Figure 17:
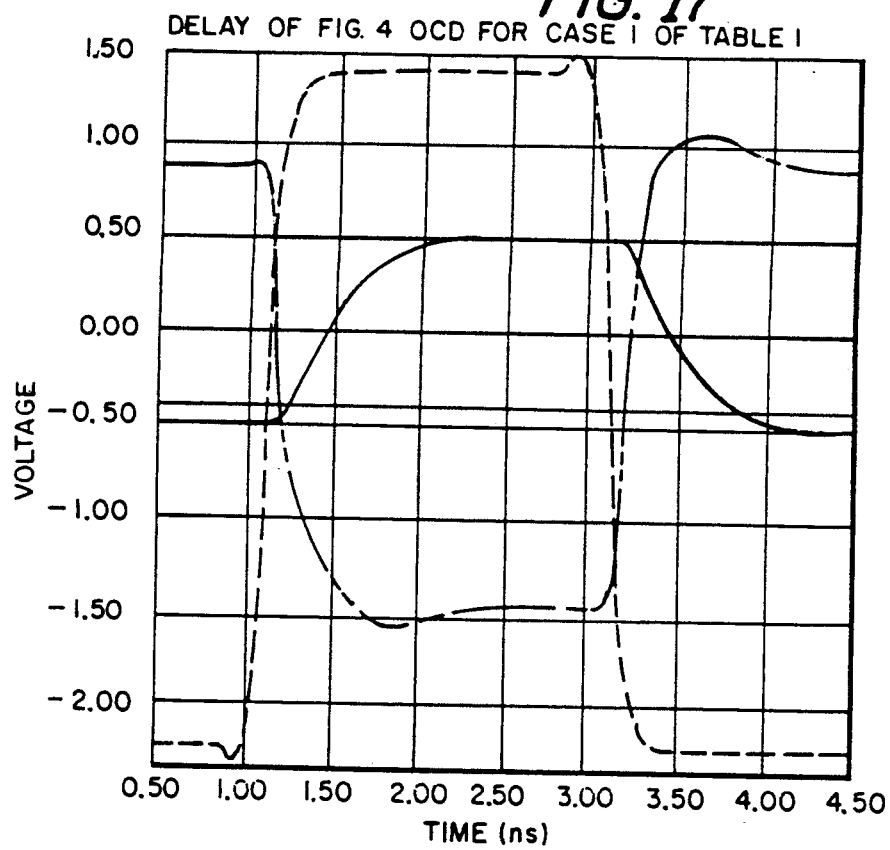

The circuit of FIG. 3, as will be evident from FIG. 8, does not have the ability to control output level as precisely as the circuit of FIG. 2 for the various process tolerances and power supply variations represented in Table 1. This is due in part to the configuration of having both devices 29 and 30 of FIG. 3 participate in the feedback function, albeit at different degrees for each of the logic states appearing on node A. As will be noted with respect to FIGS. 14, 15, 16 and 17, this embodiment has considerable advantages in permitting smaller device sizes to be used for feedback devices 29 and 30, representing a better delay characteristic for the circuit. These Figures illustrate the delay for case 1 of Table 1 for each of the circuits of FIGS. 1-4. The four plots represent the voltage at nodes 1, A, and the output pad 34.

The circuit of FIG. 4 provides voltage stability for the generated ECL-compatible output levels which is superior to the embodiments of FIGS. 1, 2 and 3. It can

TABLE 1

| Case | Description | VDD | VSS | p Leff | p Vth | n Leff | N Vth |
|---|---|---|---|---|---|---|---|
| 1 | Nominal | 1.4 V | −2.2 V | 0.50 m | 0 mV | 0.50 m | 0 mV |
| 2 | All Weak | 1.26 V | −1.98 V | 0.65 m | +150 mV | 0.65 m | +150 mV |
| 3 | All Strong | 1.54 V | −2.42 V | 0.35 m | −150 mV | 0.35 m | −150 mV |
| 4 | p Strong | 1.54 V | −2.42 V | 0.35 m | −150 mV | 0.51 m | +150 mV |
| 5 | n Strong | 1.54 V | −2.42 V | 0.51 m | +150 mV | 0.35 m | −150 mV |
| 6 | n Weak | 1.26 V | −1.98 V | 0.49 m | −150 mV | 0.65 m | +150 mV |
| 7 | p Weak | 1.26 V | −1.98 V | 0.65 m | +150 mV | 0.49 m | −150 mV |

Use of the described feedback transistors to maintan logic levels within precise tolerances can be shown with respect to variations in device dimensions, threshold voltages and power supply voltage. As was explained, the transistor parameters are selected to maintain an essentially constant voltage for each of the two ECL voltage levels at the output junction for each of corresponding CMOS logic states applied to the circuit input. Before discussing the specific performance of each of the circuits, the following generalizations can be made regarding each of the embodiments of FIGS. 1-4.

As will be obvious when viewing FIG. 1, the feedback path for a "1" ECL output level will be through P channel device 26 and N channel device 29 and N channel device 13. Node A will maintain the ECL-compatible logic voltage appearing at the junction of devices 26 and 27 with the above variations. During the alternate ECL logic state "0", the feedback path is through device 27, device 30 and device 12. The potential on node be seen from FIG. 9 that the variations in output logic levels are much smaller for this embodiment.

Slew rate performance can be illustrated for each of the embodiments of FIGS. 1-4 by referring to FIGS. 10-13. These Figures illustrate how the slew rate for all the process and power supply variations represented in Table 1 are effected. As can be seen from FIG. 13, the magnitude of the slew rate change for the circuit of FIG. 4 is superior for the various process and power supply variations represented by Table 1.

Figure 18:
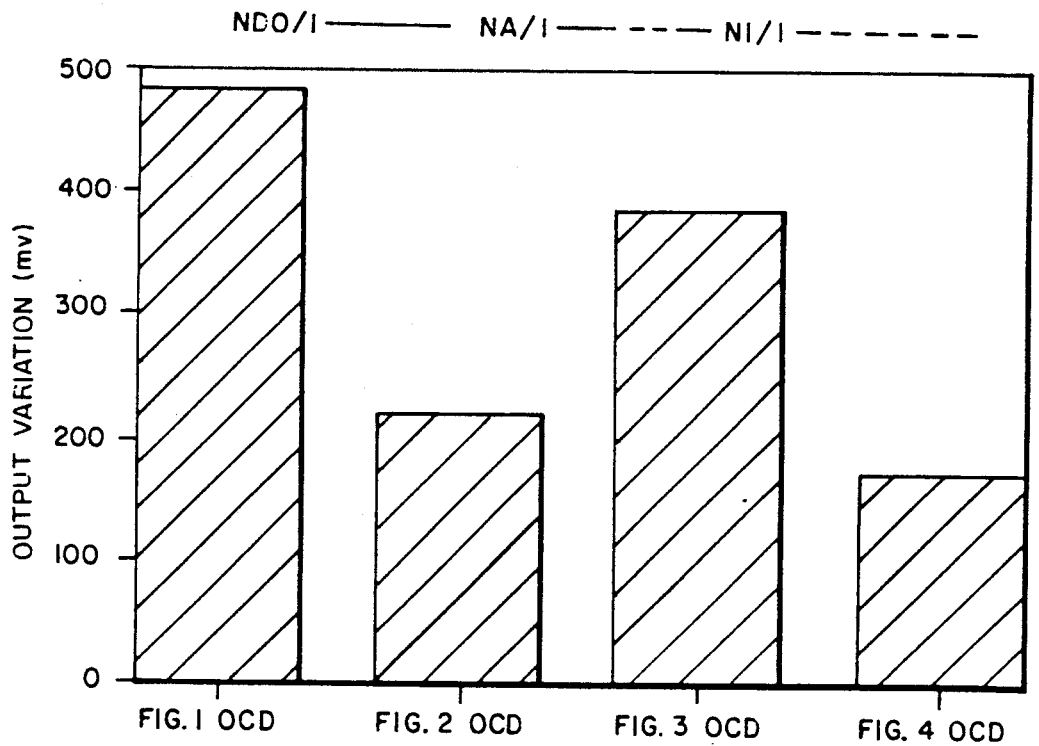
FIGS. 18, 19 and 20 are a compilation showing the respective performances for each of the circuits of FIGS. 1-4 regarding output voltage stability, slew rate variation and average propagation delay comparisons.
Figure 19:
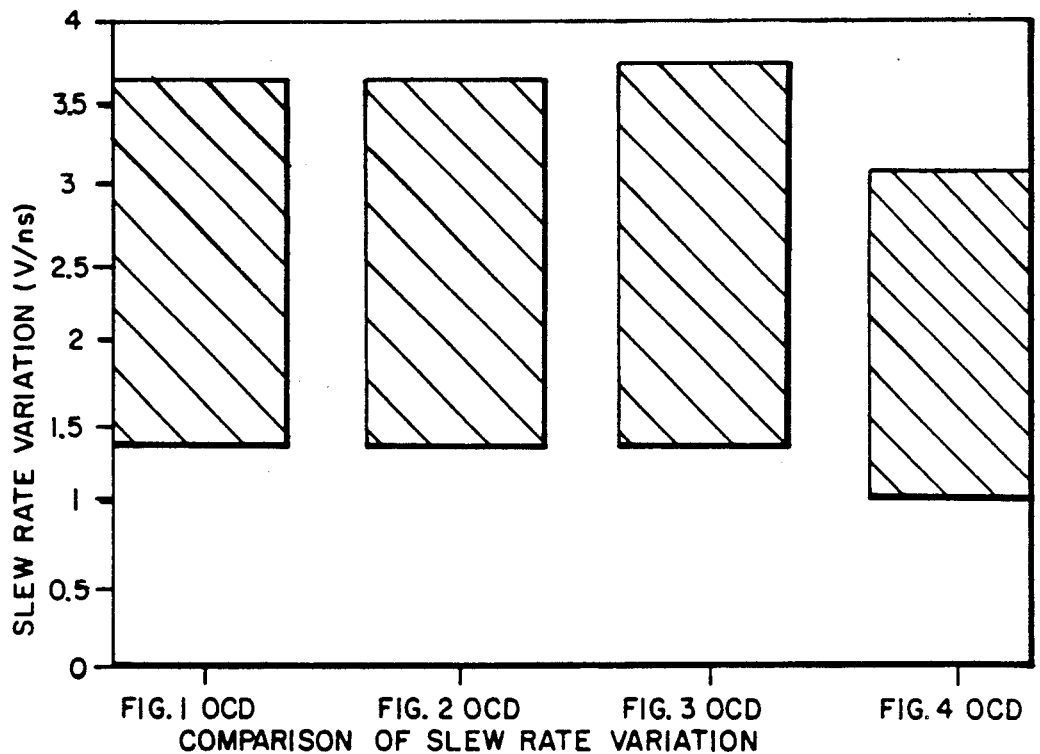
Figure 20:
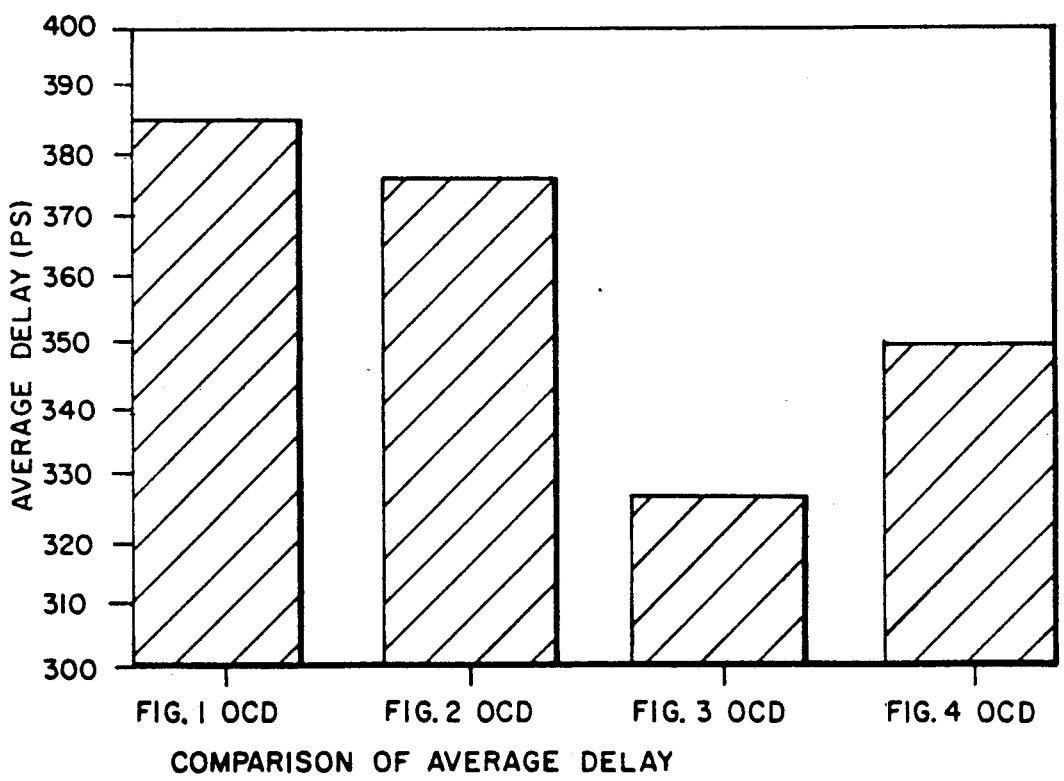

The overall performance of the circuits of FIGS. 1-4 is shown in FIGS. 18-20. The foregoing predicted performance for output variation, slew rate and average delay are summarized in bar graph form.

It is clear that each of the circuits possess unique advantages over the other. However, it is considered that FIG. 4 represents the best overall solution to balancing the requirements for slew rate, delay and output level control in the various embodiments.

Figure 5:
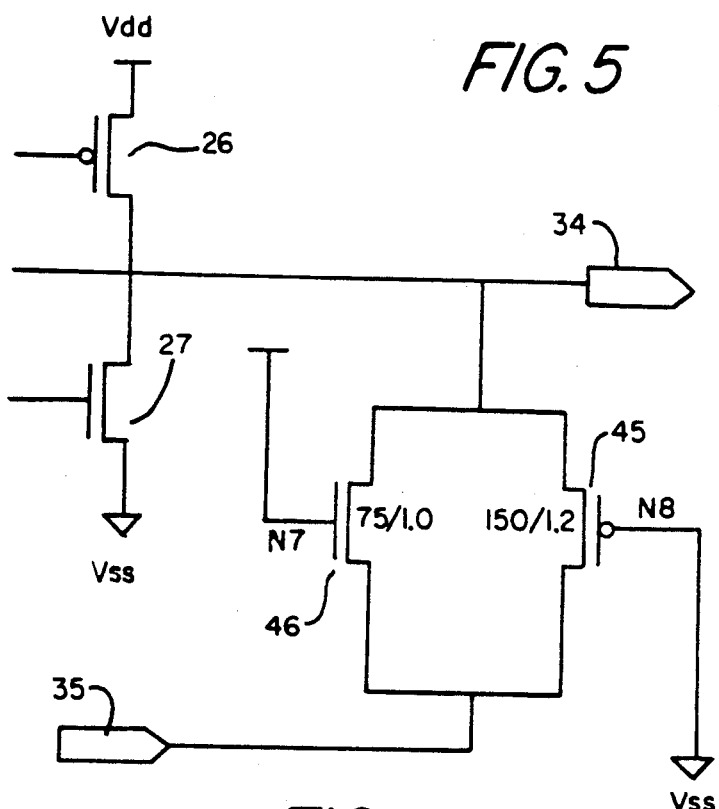
FIG. 5 illustrates the implementation of an on board load for each of the circuits of FIGS. 1, 2, 3 and 4.
Figure 6:
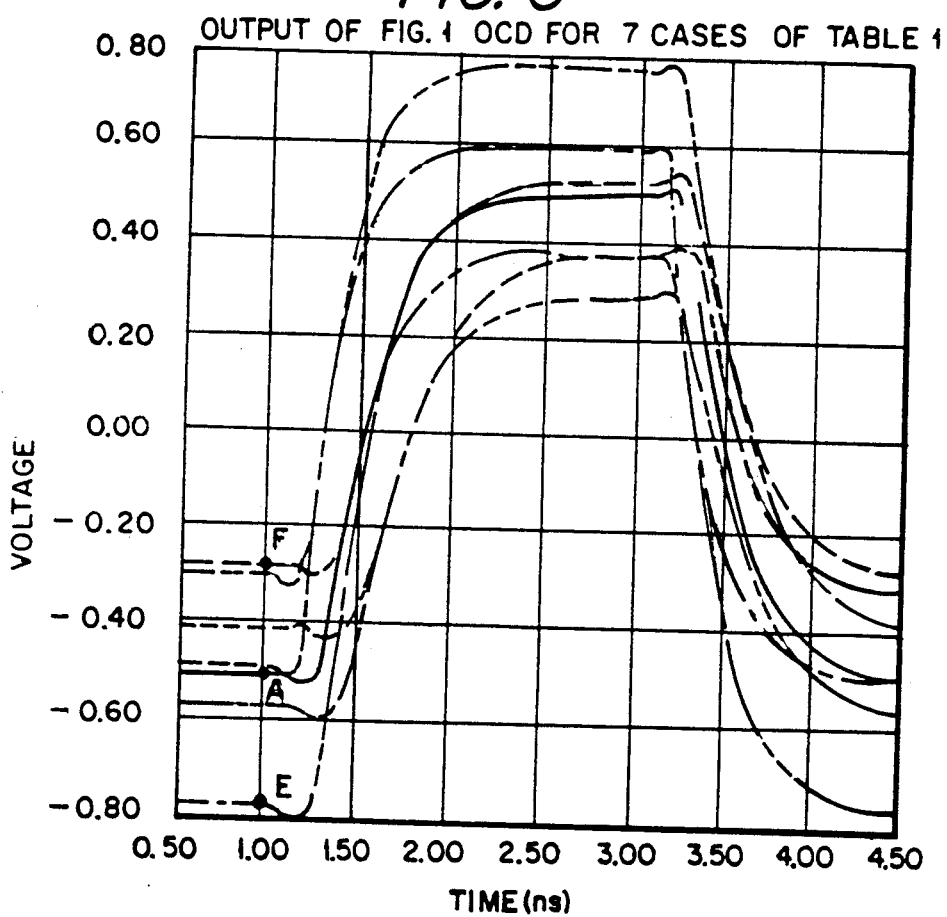
FIGS. 6-9 demonstrate the ECL-compatible output voltage level of the circuits of FIGS. 1-4 for seven different process conditions and voltage supply variations of Table 1.
Figure 7:
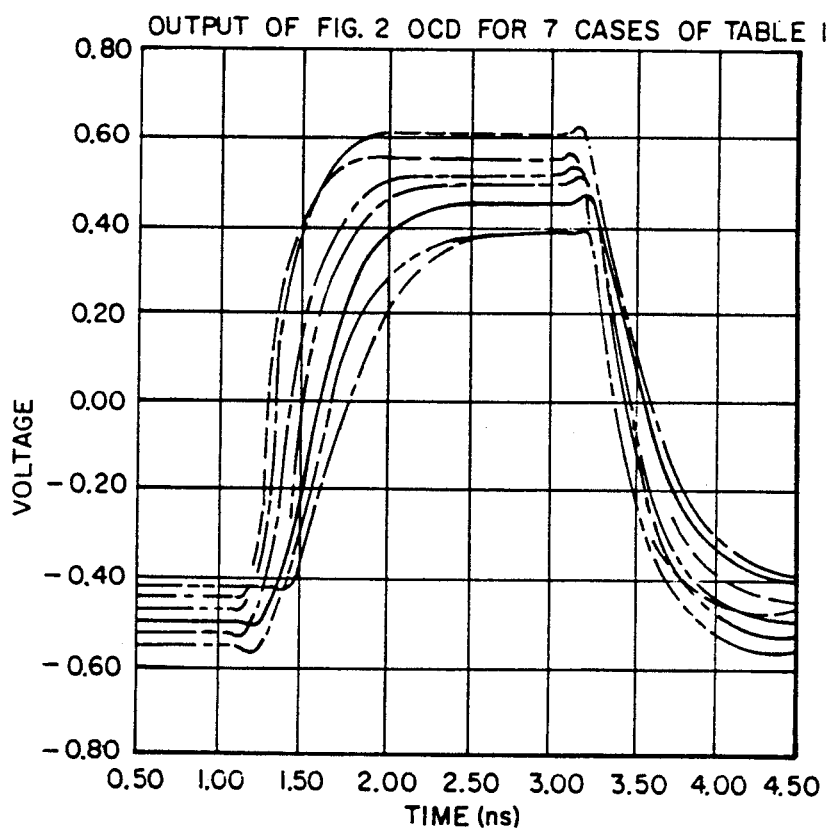

Each of the foregoing illustrations demonstrates the predicted simulated circuit performance for each of the circuits. This performance is based on the assumption that a constant load of 80 Ohms and a capacitance of 5 pf was present. The ability of the circuits illustrated in FIGS. 1-4 to perform is adversely effected by any changing load conditions which may be experienced on the output pads 34. Thus, at the cost of greater power consumption, it may be preferable to implement an internal load on the circuit such as is shown in FIG. 5 that would make it possible to drive a wide range of off-chip load with less variation in the ECL signal levels. FIG. 5 illustrates how an 80 Ohm impedance may be constructed, which is substantially resistive using two additional devices, P channel device 45 and N channel device 46. These devices will track the electrical performance of the remaining devices of the circuit and help to compensate for device variation.

During transition between output logic states, devices 45 and 46 provide an almost linear resistance over the range of voltage that occurs.

Thus, it is seen that the CMOS logic circuits of FIGS. 1-4 may be implemented in place of conventional ECL drive circuits, operating from standard CMOS logic power supply levels. The resulting compatible bipolar logic levels have a controlled output level, as well as slew rate and delay parameters compatible with ECL technology. Those skilled in the art will recognize yet other embodiments described by the claims which follow.

Having thus described our invention, what we claim as new and desire to secure by Letters Patent is:

1. A CMOS drive circuit for providing level regulated small signal logic levels comprising:
   first and second serially connected N channel and P channel devices connected to first and second CMOS power supply connections, one of said devices supplying a voltage representing a logic level to a load connected to a junction of said serially connected devices;
   a feedback circuit connected between said junction and gate connections of said first and second N channel and P channel devices; and,
   CMOS logic circuit means receiving CMOS logic signals connected to apply first and second signal levels intermediate said small signal levels and CMOS logic signal levels, to said gate connections, said feedback circuit providing feedback current to said gate connections for modifying said first and second signal levels establishing third and fourth small signal logic levels at said junction.

2. The CMOS drive circuit of claim 1 wherein said feedback circuit provides first and second parallel paths, one of which contributes substantially more current to said gate connections when a first CMOS logic level is applied to said CMOS logic circuit means, the other of which contributes substantially more feedback current when a second CMOS logic level is applied to said CMOS logic circuit means.

3. The circuit of claim 1 further comprising a resistive load connected to said junction for providing a substantially constant impedance for said junction.

4. The drive circuit of claim 3 wherein said resistive load comprises a P channel and N channel device connected in parallel, serially connecting said junction to a common terminal, and having gate connections connected to said first and second CMOS circuit power supply connections.

5. The drive circuit of claim 2 wherein said first and second parallel paths comprise, respectively, a P channel device and N channel device having gate connections connected through delay means to said logic circuit for delaying conduction of said parallel paths following a transition from one of said CMOS logic levels to another of said CMOS logic levels.

6. A CMOS drive circuit for providing regulated small signal logic levels comprising:
   (a) a CMOS logic circuit which receives CMOS logic signals, and produces first and second signal levels intermediate said CMOS logic signal levels and said small signal logic levels on an output connection;
   (b) an N channel device serially connected with a P channel device across first and second power supply connections of said CMOS logic circuit, said devices having gate connections connected to said CMOS logic circuit output connection, a junction of said serially connected N channel and P channel devices comprising an output node; and,
   first and second parallel connected P channel and N channel feedback devices connecting said output node to said CMOS logic circuit output connection, one of said feedback transistors and one of said serially connected devices establishing a first logic level on said output node, the other of said parallel connected devices and the other of said serially connected devices establishing a second small signal logic level on said output node.

7. The CMOS drive circuit of claim 6 wherein said parallel connected P channel and N channel devices have gate connections connected to each other and to said output node.

8. The CMOS drive circuit of claim 6 wherein said parallel connected P channel and N channel devices have gate connections connected to each other and to said CMOS logic circuit output connection.

9. The CMOS drive circuit of claim 6 wherein said parallel connected P channel and N channel devices have gate connections connected to said first and second CMOS circuit power supply connections.

10. The CMOS drive circuit of claim 6 wherein said parallel connected P channel and N channel devices have gate connections connected to be switched by said CMOS logic circuit and are alternately switched into a conduction mode as said CMOS logic circuit switches between said first and second logic states.

11. The CMOS drive circuit of claim 10 further comprising delay means connecting said gate connections of said parallel P channel and N channel devices to said CMOS logic circuit.

12. The CMOS drive circuit of claim 6 further comprising a load element connected between said output node and a reference potential for maintaining said ECL levels at a constant level substantially independent of additional loading conditions on said output node.

13. The CMOS drive circuit of claim 12 wherein said load device comprises:
   a P channel device connected from said output node to a common terminal having a gate connection connected to a terminal of a source of voltage potential of one polarity; and,
   an N Channel device connected from said output node to said common terminal having a gate connection connected to a second terminal of said source of voltage potential of an opposite potential.

* * * * *